(12) United States Patent
Lee et al.

(10) Patent No.: US 7,279,755 B2
(45) Date of Patent: Oct. 9, 2007

(54) SRAM CELL WITH IMPROVED LAYOUT DESIGNS

(75) Inventors: Chun-Yi Lee, Bei-Pu Village (TW); Huai-Ying Huang, Jhonghe (TW); Chii-Ming M. Wu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 119 days.

(21) Appl. No.: 11/293,340

(22) Filed: Dec. 2, 2005

(65) Prior Publication Data
US 2007/0126060 A1    Jun. 7, 2007

(51) Int. Cl.
*H01L 29/94* (2006.01)
*G11C 7/00* (2006.01)

(52) U.S. Cl. ................ 257/368; 257/369; 257/903; 257/E27.098; 257/E21.661; 365/189.11; 365/154; 365/156

(58) Field of Classification Search ............... 257/903, 257/368, 369; 365/189.11
See application file for complete search history.

(56) References Cited

U.S. PATENT DOCUMENTS

| 6,750,555 B2 * | 6/2004 | Satomi et al. ............. 365/154 |
| 2005/0248977 A1 * | 11/2005 | Liaw ......................... 365/154 |
| 2006/0102957 A1 * | 5/2006 | Liaw ......................... 257/368 |

* cited by examiner

*Primary Examiner*—Long K. Tran
*Assistant Examiner*—G. Stanley
(74) *Attorney, Agent, or Firm*—Kirkpatrick Lockhart Preston Gates Ellis LLP

(57) ABSTRACT

A 6T SRAM cell includes a first inverter having a first pull-up transistor and a first pull-down transistor serially coupled between a supply source and a complementary supply source, and a second inverter cross-coupled with the first inverter having a second pull-up transistor and a second pull-down transistor serially coupled between the supply source and the complementary supply source. The cell further includes a first pass-gate and second pass-gate transistors coupled to the first and second inverters, respectively. The first pass-gate transistor and the first pull-up transistor are respectively constructed on a first P-type well and a first N-type well adjacent to one another, which are overlaid by a first doped region and a second doped region of substantially the same width in alignment with one another, respectively.

20 Claims, 3 Drawing Sheets

SRAM CELL WITH IMPROVED LAYOUT DESIGNS

BACKGROUND

The present disclosure relates generally to integrated circuit (IC) designs, and more specifically to a layout design of six-transistor (6T) static random access memory (SRAM) cell.

A standard 6T SRAM cell has six transistors formed on a bulk semiconductor substrate. Among the six transistors, four are N-channel devices (NMOS transistors) categorized according to their functions as two pull-down transistors and two pass-gate transistors. The remaining two transistors are P-channel devices (PMOS transistors) functioning as pull-up transistors.

Conventionally, the pull-down transistor is located next to the pass-gate transistor, wherein an N-type doped region is implemented as the drains and the sources for both transistors. The pull-down transistors are required to withstand a high level of current, and are therefore designed to be large in physical size. Compared to the pull-down transistors, the pass-gate transistors are designed to be much smaller in physical size as they are not required to withstand such high level current. Thus, the doped regions of the pull-down transistors can be much wider than those of their adjacent pass-gate transistors. Due to the mismatched sizes of the pull-down transistor and the pass-gate transistor, the conventional SRAM cell is particularly susceptible to reliability defects caused by deviation of fabrication process.

Desirable in the art of IC designs are additional designs that can eliminate the width mismatch issue while reducing the overall size of the 6T SRAM cell.

SUMMARY

The present invention discloses a 6T SRAM cell. In one embodiment, the cell includes a first inverter having a first pull-up transistor and a first pull-down transistor serially coupled between a supply source and a complementary supply source, and a second inverter cross-coupled with the first inverter having a second pull-up transistor and a second pull-down transistor serially coupled between the supply source and the complementary supply source. The cell further includes a first pass-gate and second pass-gate transistors coupled to the first and second inverters, respectively. The first pass-gate transistor and the first pull-up transistor are respectively constructed on a first P-type well and a first N-type well adjacent to one another, which are overlaid by a first doped region and a second doped region of substantially the same width in alignment with one another, respectively.

The construction and method of operation of the invention, however, together with additional objectives and advantages thereof will be best understood from the following description of specific embodiments when read in connection with the accompanying drawings.

DESCRIPTION

Figure 1:
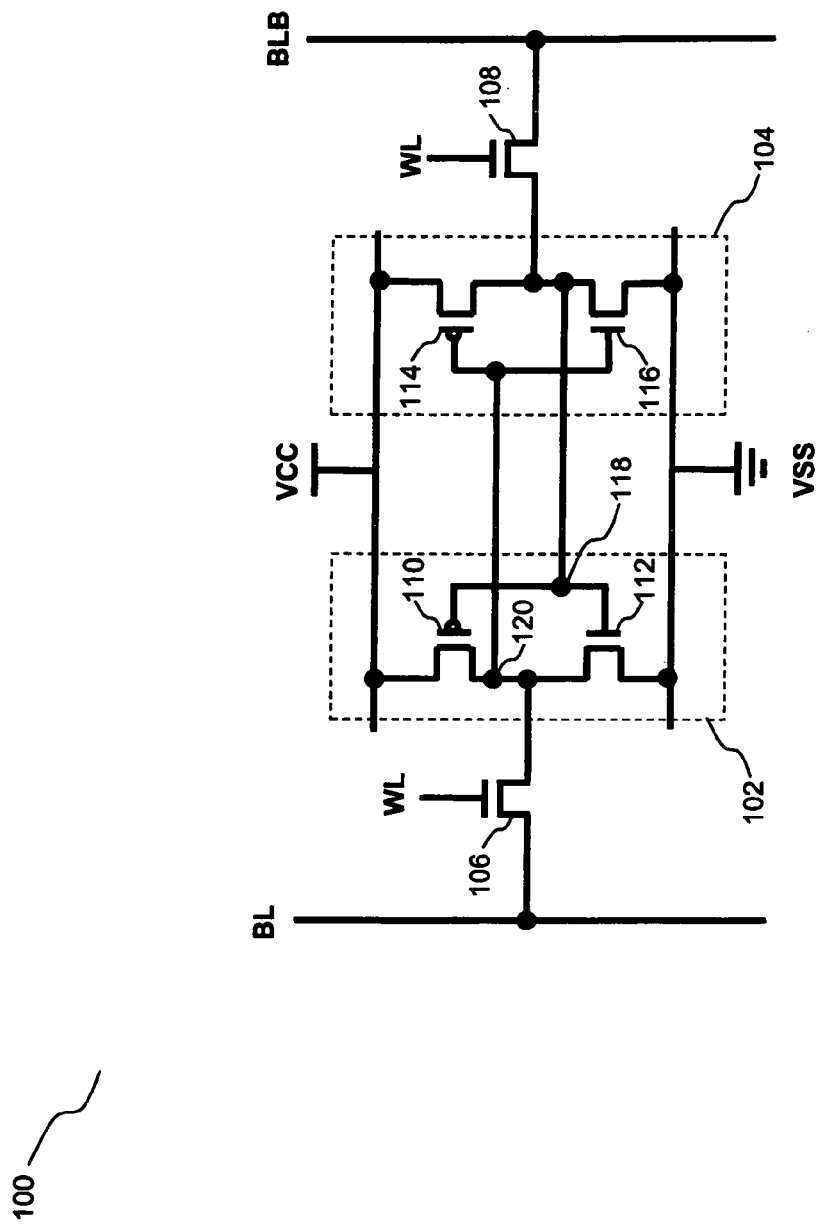
FIG. 1 schematically illustrates a standard 6T SRAM cell.

FIG. 1 schematically illustrates a standard 6T SRAM cell 100, which includes a first inverter 102, a second inverter 104 and two pass-gate transistors: a first pass-gate transistor 106 and a second pass-gate transistor 108 (both pass-gate transistors are NMOS transistors). The first inverter 102 includes a first pull-up transistor 110 (PMOS transistor) and a first pull-down transistor 112 (NMOS transistor) while the second inverter 104 includes a second pull-up transistor 114 (PMOS) and a second pull-down transistor 116 (NMOS transistor). The gates of the first pull-up transistor 110 and the first pull-down transistor 112 are coupled together at a node 118 along with the drains of the second pull-up transistor 114 and the second pull-down transistor 116. The drains of the first pull-up transistor 110 and the first pull-down transistor 112 are also coupled together at a node 120 along with the gates of the second pull-up transistor 114 and the second pull-down transistor 116. The sources of the first pull-up transistor 110 and the second pull-up transistor 114 are coupled to the supply source VCC, while the sources of the first pull-down transistor 112 and the second pull-down transistor 116 are coupled to the complementary supply source VSS. As for the first pass-gate transistor 106, the gate is coupled to a wordline (WL), the source is coupled to a bitline (BL), and the drain is coupled to the node 120. The second pass-gate transistor 108 is set up in a similar configuration where the gate is also coupled to a wordline (WL), the source is coupled to a bitline bar (BLB), and the drain is coupled to the node 118.

During read or write operations of the device, both the first pass-gate transistor 106 and the second pass-gate transistor 108 are designed to be selected or turned on by the signals on the wordlines (WL). The bitline BL or bitline bar BLB will charge up to provide enough current to program or read the SRAM cell 100.

Figure 2:
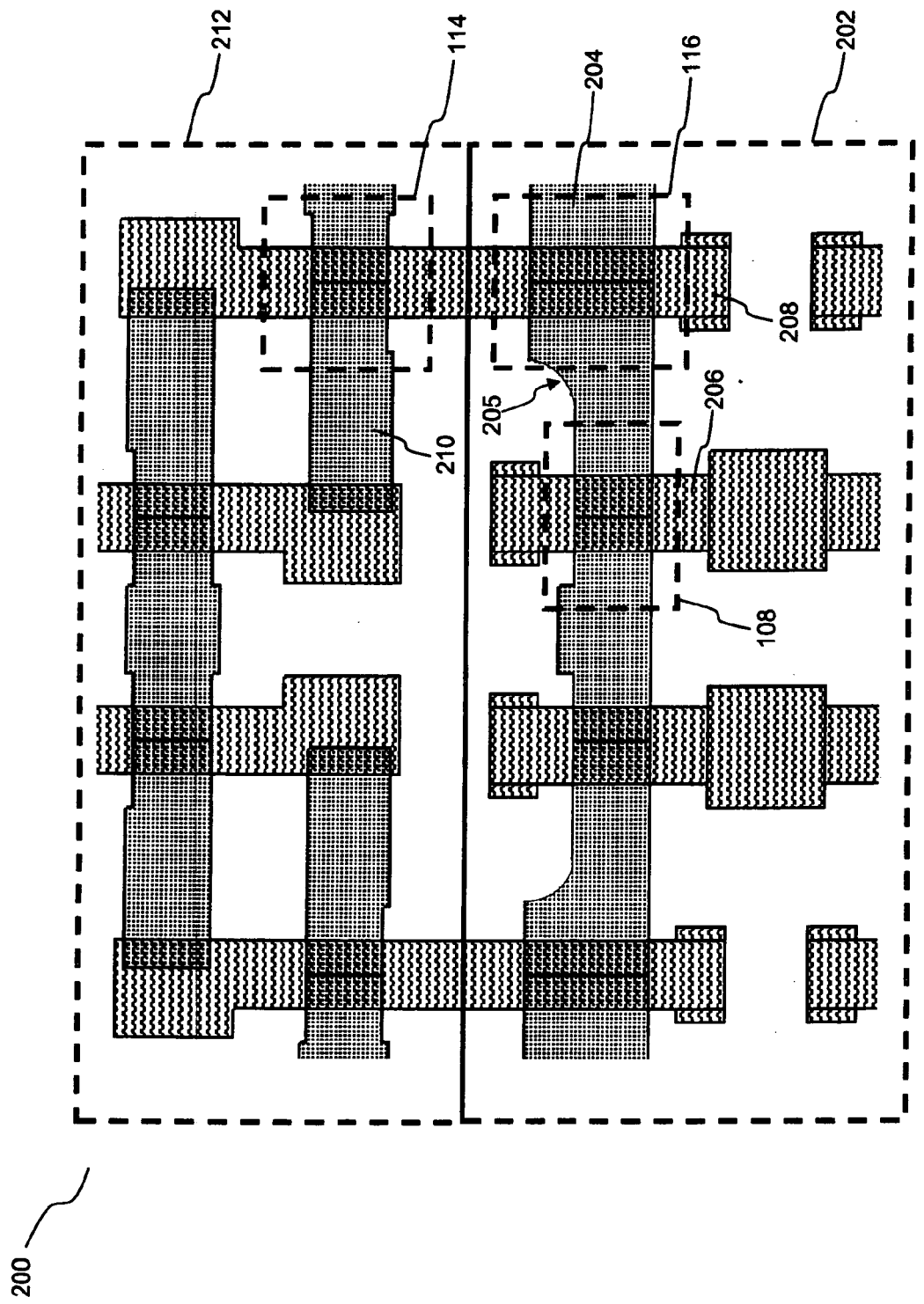
FIG. 2 illustrates a conventional layout design for the 6T SRAM cell shown in FIG. 1.

FIG. 2 illustrates a conventional layout design 200 for the standard 6T SRAM cell shown in FIG. 1. Referring to FIGS. 1 and 2 simultaneously, since the two sides of the standard 6T SRAM cell 100 are identical, only one side of the layout design that includes the second pass-gate transistor 108, the second pull-up transistor 114, and the second pull-down transistor 116 will be described in detail. The second pass-gate transistor 108 and the second pull-down transistor 116 are constructed on a P-type well 202. An elongated N-type doped region 204 formed on the P-type well 202 is implemented as the drains and the sources of the second pass-gate transistor 108 and the second pull-down transistor 116. An elongated gate structure 206 is placed above the N-type doped region 204 to form the gate of the second pass-gate transistor 108, while another elongated gate structure 208 is placed above the N-type doped region 204 to form the gate of the second pull-down transistor 116. A separate elongated P-type doped region 210 is formed under the gate structure 208 on an N-type well 212 to form the drain and the source of the second pull-up transistor 114. The elongated gate structure 208 overlies the P-type doped region 210 to form the gate of the second pull-up transistor 114.

This conventional layout design presents several reliability issues. Both the first and the second pull-down transistors 112 and 116 are required to withstand a high level of current and are designed to be large in physical size, while both the first and the second pass-gate transistors 106 and 108 are designed to be much smaller in physical size. This means that the elongated N-type doped region 204 for the first and the second pull-down transistors 112 and 116 will be much wider than the width of the same for the first and the second pass-gate transistors 106 and 108. Due to the deviation of fabrication process, it is possible that the location of the elongated gate structure 208 would shift to an intermediate area 205 between the wider portion of the N-type doped region 204 and the narrower portion of the same. This mismatch between the wider and narrower portions of the N-type doped region 204 would change the channel length of the shifted gate structure 208, thereby causing reliability issues.

The following will provide a detailed description of a layout design for a 6T SRAM cell constructed on a silicon-on-insulator (SOI) substrate by swapping the locations of the pull-up transistor and the pull-down transistor in accordance with one embodiment of the present invention. It is noted that while the proposed SRAM cell is constructed on the SOI substrate, the bulk-substrate may also be used as an alternative of the invention.

Figure 3:
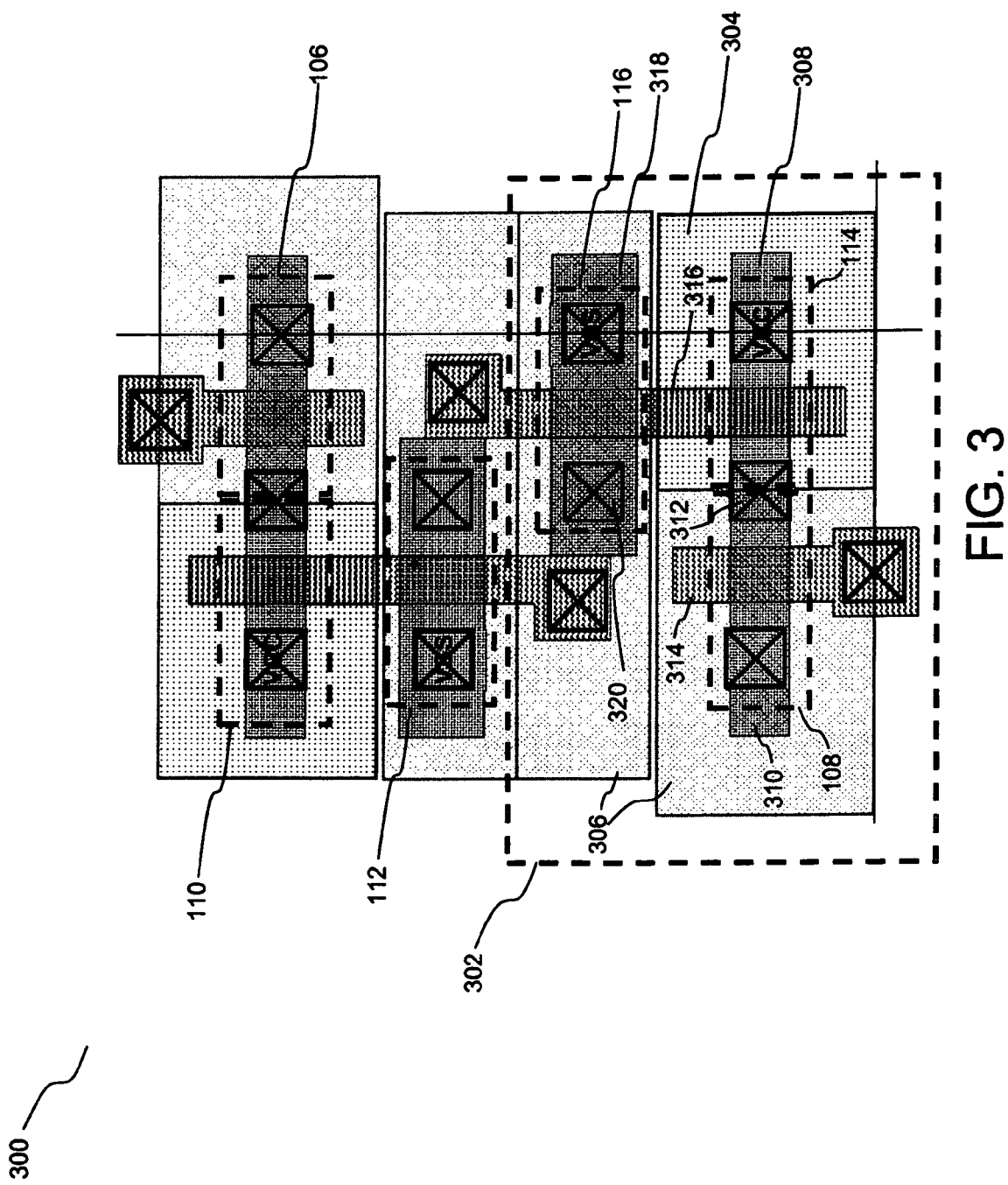
FIG. 3 illustrates a layout design for the standard 6T SRAM cell in accordance with one embodiment of the present invention.

FIG. 3 illustrates a proposed layout design 300 for a 6T SRAM cell corresponding to the circuit diagram shown in FIG. 1, in accordance with one embodiment of the present invention. The locations of the pull-up transistors and the pull-down transistors within the layout design are swapped compared to the conventional layout design shown in FIG. 2. Referring simultaneously to FIGS. 1 and 3, since the two sides of the 6T SRAM cell 100 are identical, only one side of the layout design shown in a block 302, including the second pass-gate transistor 108, the second pull-up transistor 114, and the second pull-down transistor 116, will be described in detail.

The first and the second pull-up transistors 110 and 114 are not required to withstand a high level of current, and therefore they can be designed much smaller in physical size than the first and the second pull-down transistors 112 and 116. In order to reduce the width mismatch issue between the pull-down transistors and the pass-gate transistors, the locations of the pull-up transistors and the pull-down transistors within this layout design 300 are swapped compared with the conventional layout design. Since the second pull-up transistor 114 is a PMOS transistor, it is formed on an N-type well 304 that is placed right next to a P-type well 306, on which the second pass-gate transistor is constructed. Similarly, the first pull-up transistor 110 is formed on a separated N-type well placed right next to a P-type well, on which the first pass-gate transistor 106 is constructed. The second pull-down transistor 116 and the second pass-gate transistor 108 are formed on the P-type well 306. An elongated P-type doped region 308 is disposed to form the drain and source of the second pull-up transistor 114 (a similar elongated P-type doped region is disposed to form the drain and source of the first pull-up transistor 110). An elongated N-type doped region 310 is disposed to form the drain and source of the second pass-gate transistor 108 (similar elongated N-type doped region is used to form the drain and the source of the first pass-gate transistor 106). Since the materials used to form the second pull-up transistor 114 and the second pass-gate transistor 108 are doped with different types of impurities, a soft contact 312 that has a P-type portion and N-type portion is implemented at the junction of the two elongated doped regions 308 and 310. An elongated gate structure 314 is placed above the N-type doped region 310 to form the gate of the second pass-gate transistor 108, while an elongated gate structure 316 is placed above the P-type doped region 308 to form the gate of the second pull-up transistor 114. An elongated N-type doped region 318 is implemented on the P-well 306 to form the drain and the source of the second pull-down transistor 116. The elongated gate structure 316 also extends above the elongated N-type doped region 318 to form the gate of the pull-down transistor 116. Note that the soft contact 312 is coupled to a contact 320 through metal interconnects (not shown in this figure), that is implemented at the elongated N-type doped region 318 to provide a connection between the drain of the second pull-down transistor 116 and the node 118 shown in FIG. 1.

With this proposed layout design, the width mismatch issue is avoided where the width of the P-type doped region 308 for the pull-up transistor 114 and the width of the N-type doped region 310 for the pass-gate transistor remain the same. There is no intermediate area of a different width between these two doped regions. Thus, the SRAM cell fabricated based on the layout out design 300 is less susceptible to reliability issues, when the location of the gate structure shifts due to deviation of fabrication process. The widths of the first and the second pull-down transistors 112 and 116 can be increased independently to increase the beta-ratio ($I_{DSAT}$ of the pull-down transistor to $I_{DSAT}$ of the pass-gate transistor) while the widths of the first and the second pass-gate transistors 106 and 108 and the first and the second pull-up transistors 110 and 114 can also be increased together to lower the alpha-ratio ($I_{DSAT}$ of the pull-up transistor to $I_{DSAT}$ of the pass-gate transistor).

The substrate may be silicon, gallium arsenide, gallium nitride, strained silicon, silicon germanium, silicon carbide, carbide, diamond, and/or other materials, preferably silicon-on-insulator (SOI) substrate, such as a silicon-on-sapphire substrate, a silicon germanium-on-insulator substrate, or another substrate comprising an epitaxial semiconductor layer on an insulation layer. In this embodiment, all of the transistors are constructed on an SOI substrate, so that the various wells can be disposed next to each other without having an isolation structure interposed therebetween.

Table I compares test data of threshold voltage and off-state source current for the pass-gate transistors, the pull-down transistors, and the pull-up transistors within the two different standard 6T SRAM cells created based on the proposed layout design shown in FIG. 3 and the conventional layout design shown in FIG. 2. For all three transistors, the threshold voltage (Vt) is increased by using the proposed layout design shown in FIG. 3. For example, the threshold voltage of the pass-gate transistor is increased by 42.8 mV. The off-state source current ($I_{soff}$) for the pass-gate transistor and the pull-down transistor are also reduced by at least 50%, thereby demonstrating a significant decrease in sub-threshold leakage. For example, the off-state source current for the pass-gate transistor is reduced by 58.8%.

TABLE I

| UHD SRAM Devices | STD layout 200 | STI layout 300 | Delta |
|---|---|---|---|
| PG 0.12/0.115 Vt_gm (V) | 0.3787 V | 0.4215 V | 42.8 mV |
| PG 0.12/0.115 $I_{soff}$ (μA/ea) | 34 | 14 | −58.8% |
| PD 0.18/0.1 Vt_gm (V) | 0.4639 V | 0.4874 V | 23.5 mV |
| PD 0.18/0.1 $I_{soff}$ (μA/ea) | 45 | 21 | −53.3% |
| PU 0.11/0.11 Vt_gm (V) | −0.2984 V | −0.3176 V | 19.2 mV |
| PU 0.11/0.11 $I_{soff}$ (μA/ea) | −153 | −93 | −39.2% |

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A six-transistor static random access memory cell, comprising:
   a first inverter having a first pull-up transistor and a first pull-down transistor serially coupled between a supply source and a complementary supply source;
   a second inverter cross-coupled with the first inverter, having a second pull-up transistor and a second pull-down transistor serially coupled between the supply source and the complementary supply source; and
   first pass-gate and second pass-gate transistors coupled to the first and second inverters, respectively,
   wherein the first pass-gate transistor and the first pull-up transistor are respectively constructed on a first P-type well and a first N-type well adjacent to one another, which are overlaid by a first N-type doped region and a second P-type doped region of substantially the same width and in substantial alignment with one another, respectively.

2. The cell of claim 1 wherein the first inverter, the second inverter, the first pass-gate transistor and the second pass-gate transistor are constructed on a silicon on insulator (SOI) substrate.

3. The cell of claim 1 wherein the first P-type well and the first N-type well are disposed next to one another without having any isolation structure interposed therebetween.

4. The cell of claim 1 wherein the first doped region is doped with N-type impurities for serving as source and drain regions of the first pass-gate transistor, and the second doped region is doped with P-type impurities for serving as source and drain regions of the first pull-up transistor.

5. The cell of claim 4 further comprising a soft contact, having an N-type portion and a P-type portion, dispose at a junction of the first and second doped regions.

6. The cell of claim 1 wherein the first pull-down transistor is constructed on a second P-type well adjacent to the first N-type well.

7. The cell of claim 6 further comprising a third doped region doped with N-type impurities overlying the second P-type well for serving as source and drain regions of first pull-down transistor.

8. The cell of claim 7 further comprising a first gate structure extended over the second and third doped regions.

9. The cell of claim 8 further comprising a second gate structure extended over the first doped region.

10. A six-transistor static random access memory cell, comprising:
    a first inverter having a first pull-up transistor and a first pull-down transistor serially coupled between a supply source and a complementary supply source;
    a second inverter cross-coupled with the first inverter, having a second pull-up transistor and a second pull-down transistor serially coupled between the supply source and the complementary supply source; and
    first pass-gate and second pass-gate transistors coupled to the first and second inverters, respectively,
    wherein the first pass-gate transistor and the first pull-up transistor are respectively constructed on a first P-type well and a first N-type well adjacent to one another, which are respectively overlaid by a first N-type doped region and a second P-type doped region coupled by a soft contact having a N-type portion and a P-type portion at a junction thereof, the first N-type doped region and the second P-type doped region being of substantially the same width and in substantial alignment with one another.

11. The cell of claim 10 wherein the first inverter, the second inverter, the first pass-gate transistor and the second pass-gate transistor are constructed on a silicon on insulator (SOI) substrate.

12. The cell of claim 11 wherein the first P-type well and the first N-type well are disposed next to one another without having any isolation structure interposed therebetween.

13. The cell of claim 10 wherein the first pull-down transistor is constructed on a second P-type well adjacent to the first N-type well.

14. The cell of claim 13 further comprising a third doped region doped with N-type impurities overlying the second P-type well for serving as source and drain regions of first pull-down transistor.

15. The cell of claim 14 further comprising a first gate structure extended over the second and third doped regions.

16. The cell of claim 15 further comprising a second gate structure extended over the first doped region.

17. An integrated circuit having at least one six-transistor static random access memory cell, which comprises:
    a first inverter having a first pull-up transistor and a first pull-down transistor, which are constructed on a silicon-on-insulator (SOI) substrate, serially coupled between a supply source and a complementary supply source;
    a second inverter cross-coupled with the first inverter, having a second pull-up transistor and a second pull-down transistor, which are constructed on a silicon-on-insulator (SOI) substrate, serially coupled between the supply source and the complementary supply source; and
    first pass-gate and second pass-gate transistors, which are constructed on a silicon-on-insulator (SOI) substrate, coupled to the first and second inverters, respectively,
    wherein the first pass-gate transistor and the first pull-up transistor are respectively constructed on a first P-type well and a first N-type well adjacent to one another, which are respectively overlaid by a first N-type doped region and a second P-type doped region coupled by a soft contact having a N-type portion and a P-type portion at a junction thereof, the first N-type doped region and the second P-type doped region being of substantially the same width and in substantial alignment with one another.

18. The integrated circuit of claim 17 wherein the first P-type well and the first N-type well are disposed next to one another without having any isolation structure interposed therebetween.

19. The integrated circuit of claim 17 wherein the first pull-down transistor is constructed on a second P-type well adjacent to the first N-type well.

20. The integrated circuit of claim 19 further comprising a third doped region doped with N-type impurities overlying the second P-type well for serving as source and drain regions of first pull-down transistor.

* * * * *